(12) United States Patent
Liu

(10) Patent No.: US 7,464,314 B2
(45) Date of Patent: Dec. 9, 2008

(54) METHOD FOR VALIDATING AN INTEGRATED CIRCUIT AND RELATED SEMICONDUCTOR PRODUCT THEREOF

(75) Inventor: Reu-Chieh Liu, Chang-Hua Hsien (TW)

(73) Assignee: Realtek Semiconductor Corp., HsinChu (TW)

( * ) Notice: Subject to any disclaimer, the term of this patent is extended or adjusted under 35 U.S.C. 154(b) by 505 days.

(21) Appl. No.: 10/908,440

(22) Filed: May 12, 2005

(65) Prior Publication Data

US 2006/0259836 A1 Nov. 16, 2006

(51) Int. Cl.
*G01R 31/28* (2006.01)
(52) U.S. Cl. ....................... 714/752; 714/724
(58) Field of Classification Search ................. 714/752
See application file for complete search history.

(56) References Cited

U.S. PATENT DOCUMENTS

| 5,248,936 | A | * | 9/1993 | Nakata et al. | 324/73.1 |
| 6,119,255 | A | * | 9/2000 | Akram | 714/724 |
| 7,228,155 | B2 | * | 6/2007 | Saunders | 455/558 |
| 2005/0024070 | A1 | * | 2/2005 | Miller | 324/754 |
| 2005/0070268 | A1 | * | 3/2005 | Hakkinen et al. | 455/423 |
| 2006/0200715 | A1 | * | 9/2006 | Avery et al. | 714/724 |

\* cited by examiner

*Primary Examiner*—M. Mujtaba K Chaudry
*Assistant Examiner*—Enam Ahmed
(74) *Attorney, Agent, or Firm*—Winston Hsu

(57) ABSTRACT

A method for converting an integrated circuit into a test circuit for validating functionality of the integrated circuit is disclosed. The integrated circuit is formed on a wafer, and includes a first inner node and a second inner node, wherein the first and second nodes are not floating. The method includes: providing a wire; and utilizing the wire to electrically connect the first inner node to the second inner node, wherein the wire crosses a scribe line of the wafer.

20 Claims, 2 Drawing Sheets

METHOD FOR VALIDATING AN INTEGRATED CIRCUIT AND RELATED SEMICONDUCTOR PRODUCT THEREOF

BACKGROUND OF INVENTION

1. Field of the Invention

The invention relates to a method for converting an integrated circuit into a test circuit for validating functionality of the integrated circuit and related semiconductor product thereof, and more particularly, to a method for converting an RF integrated circuit into a test circuit for validating functionality of the RF integrated circuit and a related semiconductor product thereof.

2. Description of the Prior Art

In semiconductor producing procedures, many integrated circuits (chips) are manufactured on a wafer. As is well known by those skilled in the art, in order to filter out defective chips, testing procedures are an important step in the manufacturing process. Out of all kinds of testing procedures, including on-wafer testing, module testing, and packaging testing, on-wafer testing is the most important test. For example, if defective chips are detected in the on-wafer test, these defective chips can be removed before packing or assembling of modules. If, however, they are undetected, some defective chips may be packaged or some assembled modules may contain defective chips. Evidently, much time and money is wasted because these defective chips cannot be utilized.

On-wafer testing is often performed utilizing a probing method or a loop-back method. The probing method utilizes a probing mechanism to test the chips. A well-known probe card can provide this function. The probe card comprises a plurality of probes, which can be electrically connected to the testing pads on the wafer, where the testing pads are connected to the inner circuits of the chips. The probe card can provide a test signal (for example, a test current or a test voltage), and detect whether the chip processes the test signal. Therefore, the defective chips, which cannot process the test signal well, can be detected by the probe card.

If the probing method is utilized to test radio frequency (RF) chips, however, another problem occurs. Because RF signals have high frequencies, the matching relationship between the input resistance and the output resistance is directly related to the test signal, which is injected into the RF integrated circuits for testing. Therefore, the contacting interface between the testing pads and the probe must be of a high quality in order to prevent a mismatch from occurring. This requirement also raises costs.

The loop-back method, the second method mentioned above, utilizes a switch to electrically connect the transmitter and receiver of the RF integrated circuit so that a loop-back link test circuit is formed. When the on-wafer test is performed, the switch is closed in order to conduct a test signal (please note that the test signal can be generated from the transmitter of the RF integrated circuit, and the test signal will be received by the receiver of the RF integrated circuit, hence it is called a loop-back link). In practical applications, however, the switch is non-ideal and causes signal distortion when the RF integrated circuit is utilized.

SUMMARY OF INVENTION

It is therefore one of the primary objectives of the claimed invention to provide a method for converting an RF integrated circuit into a test circuit for validating functionality of the RF integrated circuit and a related semiconductor product thereof, to solve the above-mentioned problem.

According to an exemplary embodiment of the claimed invention, a method for converting an integrated circuit into a test circuit for validating functionality of the integrated circuit is disclosed. The integrated circuit is formed on a wafer, and comprises a first inner node and a second inner node, wherein the first and second nodes are not floating. The method comprises providing a wire, and utilizing the wire to electrically connect the first inner node to the second inner node, wherein the wire crosses a scribe line of the wafer.

According to another exemplary embodiment of the claimed invention, a method for converting a first and a second integrated circuit into a test circuit for validating functionality of the first and the second integrated circuits is disclosed. The first and the second integrated circuits are formed on a wafer, wherein the first integrated circuit comprises a first inner node, and the second integrated circuit comprises a second inner node. The first and second inner nodes are not floating. The method comprises providing a wire, and utilizing the wire to electrically connect the first inner node to the second inner node, wherein the wire crosses a scribe line of the wafer.

According to another exemplary embodiment of the claimed invention, a semiconductor product formed on a wafer is disclosed. The semiconductor product comprises: an integrated circuit, comprising a first inner node and a second inner node, wherein the first and second nodes are not floating; and a wire electrically connected between the first and second inner nodes for converting the integrated circuit into a test circuit used to validate functionality of the integrate circuit, wherein the wire crosses a scribe line of the wafer.

According to another exemplary embodiment of the claimed invention, a semiconductor product formed on a wafer is disclosed. The semiconductor product comprises: a first integrated circuit, comprising a first inner node, wherein the first inner node is not floating; a second integrated circuit, comprising a second inner node, wherein the second inner node is not floating; and a wire electrically connected between the first and the second inner nodes for converting the first and the second integrated circuits into a test circuit used to validate functionality of the first and the second integrated circuits, wherein the wire crosses a scribe line of the wafer.

The present invention can utilize wires to rewire an integrated circuit on a wafer. Therefore, the integrated circuit can be utilized as a test circuit. Furthermore, because the wires are cut off after the wafer is sawed, the integrated circuit can be utilized according to the original design. In addition, the present invention can validate functionality of an RF integrated circuit on a wafer without utilizing a switch to connect the transmitter and the receiver of said RF integrated circuit.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
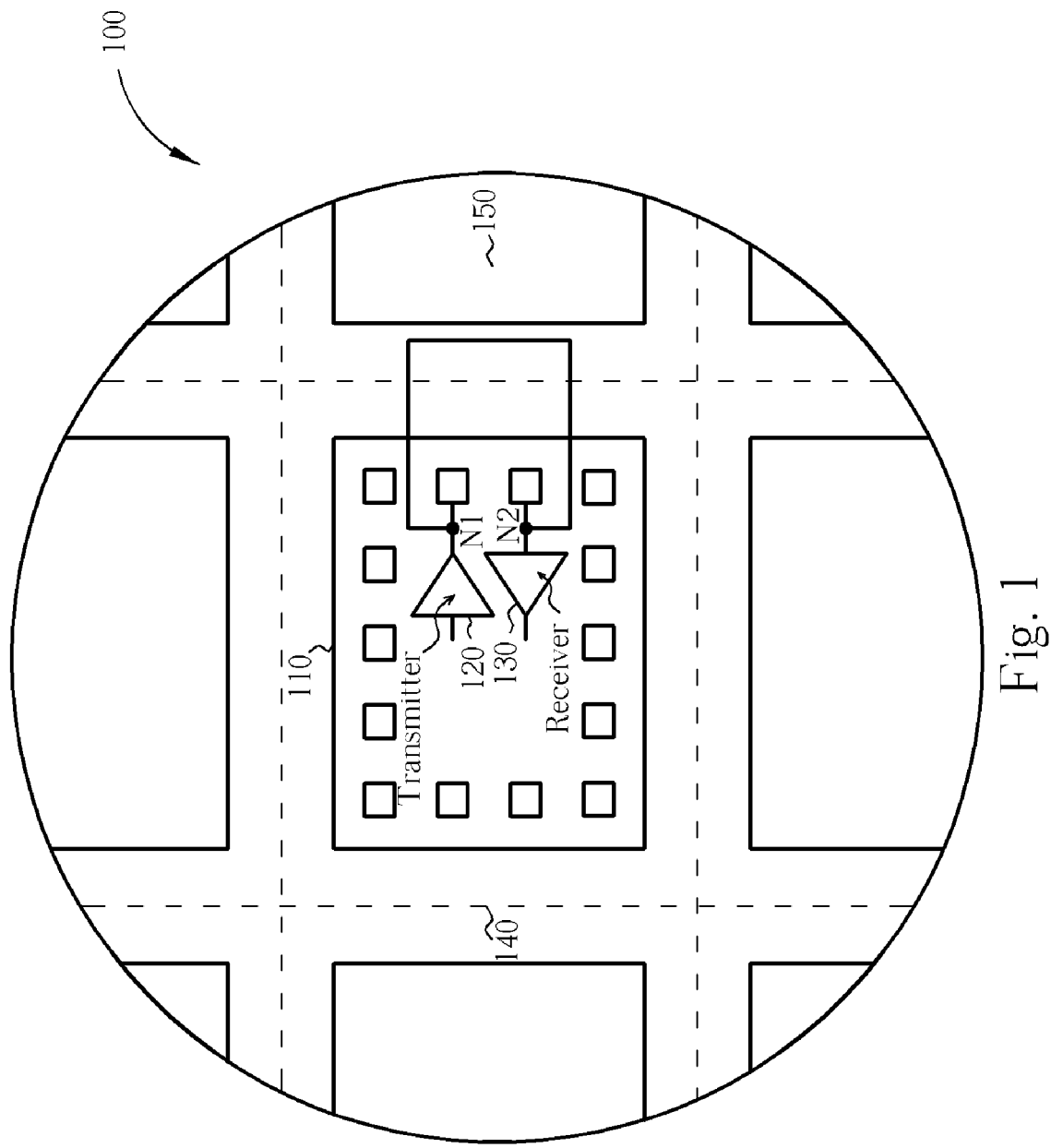
FIG. 1 is a diagram of a part of a wafer of a first embodiment according to the present invention.

The present invention provides a method for utilizing the original RF integrated circuit to form a test circuit. Please refer to FIG. 1, which is a diagram of a part of a wafer 100 of a first embodiment according to the present invention. As shown in FIG. 1, the wafer 100 comprises a plurality of RF integrated circuits 110. In order to simply illustrate the related circuits, a transmitter 120 and receiver 130 of only one RF circuit 110 is shown. Transmitters and receivers of other RF integrated circuits 110 are omitted here. The dotted line 140 shown in FIG. 1 represents the scribe lines of the wafer. In other words, the wafer 100 will be sawed along the scribe lines in order to define a chip area of each integrated circuit 110. This means that a chip can be made, or the following steps (such as the above-mentioned packaging step or module assembling step) can be performed.

For performing the aforementioned on-wafer test, the transmitter 120 and receiver 130 should be electrically connected to each other. As mentioned above, however, there is no ideal switch capable of establishing the electrical connection between the transmitter 120 and the receiver 130.

Therefore, as mentioned above, a wire 150 is provided to connect between a node N1 of the transmitter 120 and another node N2 of the receiver 130. Please note that the wire 150 crosses the scribe line 140. This means that the wire 150 is cut off when the wafer 100 is sawed; in other words, the electrical connection between the transmitter 120 and the receiver 130 is interrupted after the wafer 100 is sawed. The original function of the RF integrated circuit will not be influenced by the wire 150 after the wire 150 is cut off. The wire 150 and the scribe line 140 are utilized for converting the original RF integrated circuit 110 into a loop-back link test circuit, and the RF integrated circuit 110 can be validated as mentioned above. That is, the RF integrated circuit 110 can generate a test signal and transfer the test signal through the transmitter 120, and then receive the test signal from the receiver 130. The RF integrated circuit 110 can process the test signal to detect whether it can correctly process the test signal.

Figure 2:
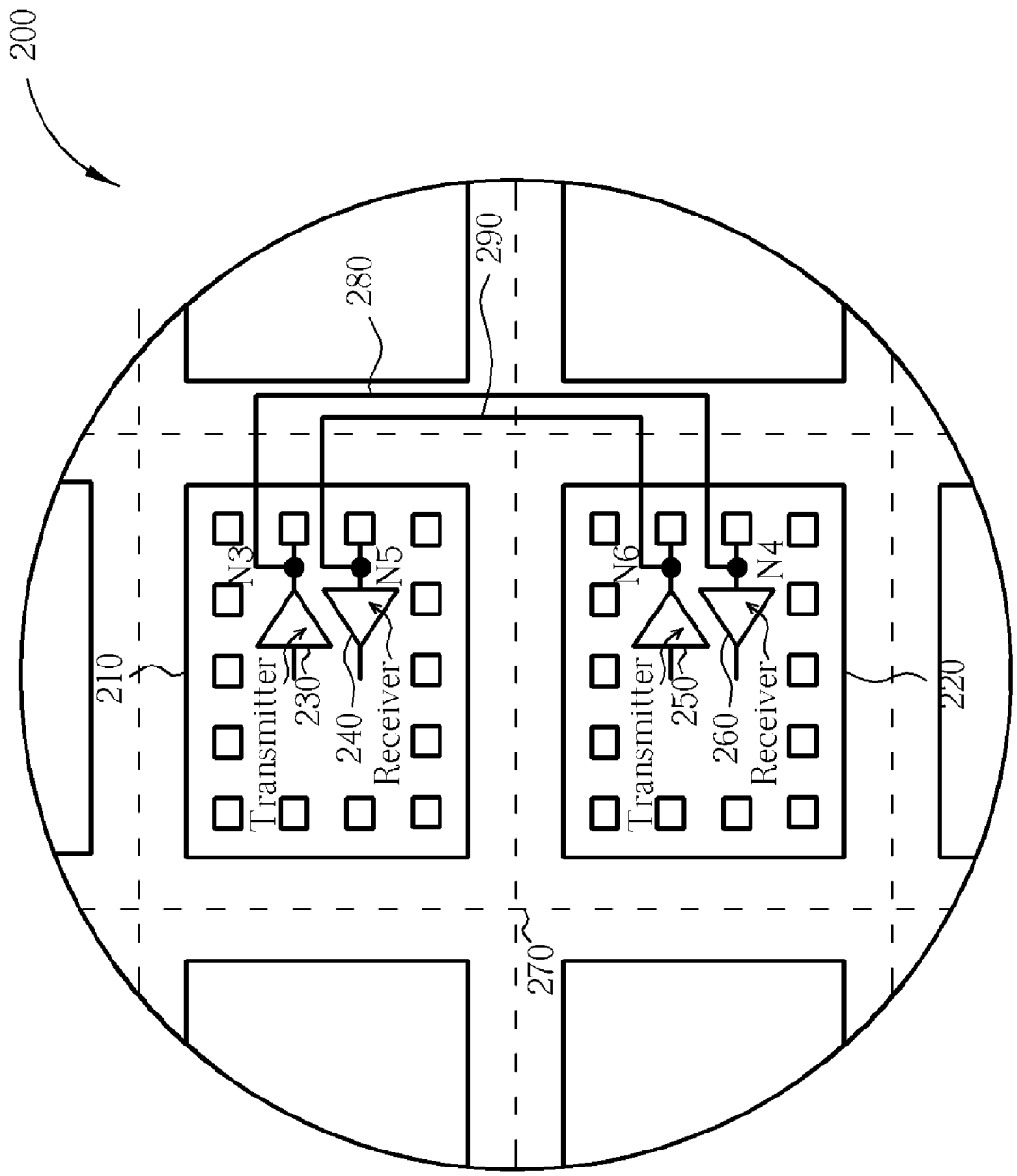
FIG. 2 is a diagram of a part of a wafer of a second embodiment according to the present invention.

In addition, we can also utilize the wire to electrically connect different RF integrated circuits for simultaneously validating functionalities of the RF integrated circuits. Please refer to FIG. 2, which is a diagram of a part of a wafer 200 of a second embodiment according to the present invention. Theoretically, the wafer 200 should comprise a plurality of RF circuits. For simple illustration of related circuits, only two RF integrated circuits 210 and 220 are shown in FIG. 2. Other RF integrated circuits are omitted here. The RF integrated circuit 210 comprises a transmitter 230 and a receiver 240. The RF integrated circuit 220 comprises a transmitter 250 and a receiver 260. In addition, the dotted line 270 represents a scribe line of the wafer 200 as in the first embodiment shown in FIG. 1.

As shown in FIG. 2, a wire 280 is utilized to electrically connect the node N3 of the transmitter 230 of the RF integrated circuit 210 and the node N4 of the receiver 260 of the RF integrated circuit 220. Therefore, when the on-wafer test is performed, the RF integrated circuit 210 can be utilized to generate a test signal and output the test signal through the transmitter 230. Then, the test signal is inputted into the receiver 260 of the RF integrated circuit 220. The RF integrated circuit 220 can process the test signal. The characteristics of generating the test signal or receiving the test signal can be utilized to validate the functionalities of the RF integrated circuits 210 and 220. As can be seen from the diagram, the other nodes N5 and N6 can also be utilized. In this embodiment, another wire 290 is utilized to electrically connect the node N5 of the receiver 240 of the RF integrated circuit 210 and the node N6 of the transmitter 250 of the RF integrated circuit 220. This way, when the on-wafer test is performed, the characteristic of generating the test signal of the RF integrated circuit 210 and the characteristic of processing the test signal of the RF integrated circuit 220 can also be utilized to check the functionalities of the RF integrated circuits 210 and 220.

In this embodiment, the wires 280 and 290 both cross the scribe line 270. As in the first embodiment, the wires 280 and 290 are cut off after the wafer is sawed. Therefore, although the wires 280 and 290 convert the RF integrated circuits 210 and 220 into a test circuit, they do not influence the original functionality of the RF integrated circuits 210 and 220. That is, after the wafer is sawed, the RF integrated circuit 210 and 220 can perform as originally required.

Please note that the above-mentioned nodes N1, N2, N3, N4, N5, and N6 are all nodes of the RF integrated circuits. In other words, they are not floating. That is, the present invention utilizes a wire to connect two inner nodes, which are not floating, so that the functionality of the RF integrated circuit changes (for example, the RF integrated circuit is converted into a test circuit) because of the connected wire. After the wafer is sawed, the wire is cut off. The original functionality of the RF integrated circuit can be retained. This means that the wire will not influence the original functionality of the RF integrated circuit.

Please note that the RF integrated circuits are only utilized as a preferred embodiment, and not a limitation of the present invention. The concept of utilizing a wire to rewire an integrated circuit on a wafer can be utilized in all kinds of circuits (including MF circuits, LF circuits, or other chips).

In contrast to the prior art, the present invention can utilize wires to rewire an integrated circuit on a wafer. Therefore, the integrated circuit can be utilized as a test circuit. Moreover, because the wires are cut off after the wafer is sawed, the integrated circuit can be utilized according to the original design. In addition, the present invention can validate functionality of an RF integrated circuit on a wafer without utilizing a switch to connect the transmitter and the receiver of the RF integrated circuit.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for converting an integrated circuit having an original functionality into a test circuit for validating the original functionality of the integrated circuit, the integrated circuit being formed on a wafer, the integrated circuit comprising a first inner node and a second inner node, where the first and second nodes are not floating, the method comprising:

providing a wire; and utilizing the wire to electrically connect the first inner node to the second inner node to thereby convert the integrated circuit into the test circuit, wherein the wire utilized for transmitting a test signal between the first and the second nodes crosses a scribe line of the wafer;

wherein before the wafer is sawed, the wire makes the integrated circuit fail to perform the original functionality; and after the wafer is sawed, the wire is cut off, thereby making the integrated circuit retain the original functionality.

2. The method of claim 1, wherein the first inner node is an input node of the integrated circuit, and the second inner node is an output node of the integrated circuit.

3. The method of claim 2, wherein the integrated circuit is an RF integrated circuit.

4. The method of claim 3, wherein the first inner node is coupled to a receiver of the RF integrated circuit, and the second inner node is coupled to a transmitter of the RF integrated circuit.

5. A method for converting a first integrated circuit having a first original functionality and a second integrated circuit having a second original functionality into a test circuit for validating the first original functionality and the second original functionality of the first and the second integrated circuits, the first and the second integrated circuits being formed on a wafer, the first integrated circuit comprising a first inner node, the second integrated circuit comprising a second inner node, where the first and second nodes are not floating, the method comprising:
- providing a wire; and
- utilizing the wire to electrically connect the first inner node to the second inner node to thereby convert the first and the second integrated circuits into the test circuit, wherein the wire utilized for transmitting a test signal between the first and the second nodes crosses a scribe line of the wafer;
- wherein before the wafer is sawed, the wire makes the first and the second integrated circuits fail to perform the first original functionality and the second original functionality, respectively; and after the wafer is sawed, the wire is cut off, thereby making the first and the second integrated circuits retain the first original functionality and the second original functionality, respectively.

6. The method of claim 5, wherein the first inner node is an input node of the first integrated circuit, and the second inner node is an output node of the second integrated circuit.

7. The method of claim 6, wherein the first and the second integrated circuits are both RF integrated circuits.

8. The method of claim 7, wherein the first inner node is coupled to a receiver of the first RF integrated circuit, and the second inner node is coupled to a transmitter of the second RF integrated circuit.

9. A semiconductor product formed on a wafer, comprising:
- an integrated circuit, having an original functionality and comprising a first inner node and a second inner node, wherein the first and second nodes are not floating; and
- a wire electrically connected between the first and second inner nodes for converting the integrated circuit into a test circuit utilized to validate the original functionality of the integrated circuit, wherein the wire utilized for transmitting a test signal between the first and the second nodes crosses a scribe line of the wafer;
- wherein before the wafer is sawed, the wire makes the integrated circuit fail to perform the original functionality; and after the wafer is sawed, the wire is cut off, thereby making the integrated circuit retain the original functionality.

10. The semiconductor product of claim 9, wherein the first inner node is an input node of the integrated circuit, and the second inner node is an output node of the integrated circuit.

11. The semiconductor product of claim 10, wherein the integrated circuit is an RF integrated circuit.

12. The semiconductor product of claim 11, wherein the first inner node is coupled to a receiver of the RF integrated circuit, and the second inner node is coupled to a transmitter of the RF integrated circuit.

13. A semiconductor product formed on a wafer, comprising:
- a first integrated circuit, having a first original functionality and comprising a first inner node, wherein the first inner node is not floating;
- a second integrated circuit, having a second original functionality and comprising a second inner node, wherein the second inner node is not floating; and
- a wire electrically connected between the first and the second inner nodes for converting the first and the second integrated circuits into a test circuit utilized to validate the first original functionality and the second original functionality of the first and the second integrated circuits, wherein the wire utilized for transmitting a test signal between the first and the second nodes crosses a scribe line of the wafer;
- wherein before the wafer is sawed, the wire makes the first and the second integrated circuits fail to perform the first original functionality and the second original functionality, respectively; and after the wafer is sawed, the wire is cut off, thereby making the first and the second integrated circuits retain the first original functionality and the second original functionality, respectively.

14. The semiconductor product of claim 13, wherein the first inner node is an input node of the first integrated circuit, and the second inner node is an output node of the second integrated circuit.

15. The semiconductor product of claim 14, wherein the first and the second integrated circuits are RF integrated circuits.

16. The semiconductor product of claim 15, wherein the first inner node is coupled to a receiver of the first RF integrated circuit, and the second inner node is coupled to a transmitter of the second RF integrated circuit.

17. The method of claim 4, wherein the RF integrated circuit generates the test signal.

18. The method of claim 8, wherein the RF integrated circuit generates the test signal.

19. The method of claim 12, wherein the RF integrated circuit generates the test signal.

20. The method of claim 16, wherein the RF integrated circuit generates the test signal.

* * * * *